United States Patent
Chenakin

(10) Patent No.: US 9,819,308 B1
(45) Date of Patent: Nov. 14, 2017

(54) SYSTEM AND METHOD FOR REDUCING PHASE NOISE IN HIGH FREQUENCY YIG OSCILLATORS

(71) Applicant: MICRO LAMBDA WIRELESS, INC., Fremont, CA (US)

(72) Inventor: Oleksandr Chenakin, Morgan Hill, CA (US)

(73) Assignee: Micro Lambda Wireless, Inc., Fremont, CA (US)

( * ) Notice: Subject to any disclaimer, the term of this patent is extended or adjusted under 35 U.S.C. 154(b) by 0 days.

(21) Appl. No.: 15/420,048

(22) Filed: Jan. 30, 2017

(51) Int. Cl.
  *H03K 3/03* (2006.01)
  *H03B 5/18* (2006.01)
  *H01P 1/218* (2006.01)
  *H01P 1/20* (2006.01)
  *H01P 7/00* (2006.01)

(52) U.S. Cl.
  CPC .......... *H03B 5/1882* (2013.01); *H01P 1/20* (2013.01); *H01P 1/218* (2013.01); *H01P 7/00* (2013.01); *H03B 5/18* (2013.01); *H03B 5/1894* (2013.01); *H03B 2201/0241* (2013.01); *H03B 2201/035* (2013.01)

(58) Field of Classification Search
  CPC .......... H03B 5/1894; H03B 2201/0241; H03B 2201/035; H03B 5/18; H01P 1/20; H01P 1/218; H01P 7/00
  USPC ........... 331/96; 333/202, 1.1; 327/494; 455/326
  See application file for complete search history.

(56) References Cited

U.S. PATENT DOCUMENTS

| | | | |
|---|---|---|---|
| 4,630,002 A * | 12/1986 | Leiba | H03B 5/1894 331/117 D |
| 5,115,209 A | 5/1992 | Grace | |
| 5,200,713 A | 4/1993 | Grace | |
| 8,350,629 B2 * | 1/2013 | Parrott | H03B 5/1888 331/36 L |

\* cited by examiner

*Primary Examiner* — Arnold Kinkead
(74) *Attorney, Agent, or Firm* — Stephen E. Zweig

(57) ABSTRACT

A dual-resonator YIG oscillator with a main YIG resonator and a stabilizing YIG resonator both suspended in a common magnetic field. The main YIG resonator takes on the high-Q factor aspects of the oscillator, while the stabilizing YIG resonator helps stabilize the operation of the main YIG resonator, and also allows the main YIG resonator operate at higher magnetic field strengths, achieving higher frequency operation. The stabilizing YIG resonator also enables the oscillator's active device to operate in a more linear, lower phase noise, regime. As compared to conventional YIG oscillators, the disclosed dual resonator YIG oscillator provides significant performance improvements, such as higher frequency operation, lower power consumption, higher tuning speed, and lower phase noise.

20 Claims, 7 Drawing Sheets

SYSTEM AND METHOD FOR REDUCING PHASE NOISE IN HIGH FREQUENCY YIG OSCILLATORS

BACKGROUND OF THE INVENTION

Field of the Invention

The invention relates to devices and methods for high frequency fundamental signal generation. More particularly, it relates to ferrite oscillators, such as yttrium-iron-garnet (YIG) oscillators.

Description of the Related Art

YIG oscillators, often formed from a single small sphere of Yttrium Iron Garnet material, are widely used in the microwave field. Such oscillators are described by the work of Grace, U.S. Pat. No. 3,533,016, Dupre U.S. Pat. No. 3,668,554, and others. See also R. Trew, "*Design Theory for Broad-Band YIG-Tuned FET Oscillators*," in *IEEE Transactions on Microwave Theory and Techniques*, Vol. MTT-27, January 1979, pp. 8-14. Such oscillators have several advantages over alternative approaches, and can provide relatively high oscillation frequency, wide tuning range, low phase noise, and excellent tuning linearity.

Grace, U.S. Pat. Nos. 5,115,209 and 5,200,713 have described a device with two independent single-YIG oscillators, which were configured to work in different frequency bands.

A simplified block diagram of a conventional (prior art) YIG oscillator (100) is shown in FIG. 1. FIG. 2 shows a simplified cross-sectional view of an exemplary magnetic structure of a conventional (prior art) YIG oscillator.

A typical YIG oscillator (100) comprises a high-Q spherical YIG resonator (102) (e.g. a YIG sphere), that is held in a magnetic field (see FIG. 2), as well as an active device (104) (such as a transistor) that is used, in conjunction with an electrical power source (not shown), to compensate for energy losses during operation by generating a dynamic negative resistance that compensates for resonator energy loss.

Typically a piece of wire (106), often called a coupling loop, but here referred to as a coupling wire, is partially wound around the YIG sphere (102) (often about half of the YIG sphere), and is positioned so that the coupling wire (106) can magnetically couple to the YIG sphere (resonator).

A simplified cross-sectional view (200) of an exemplary magnetic structure of a conventional (prior art) YIG oscillator is shown in FIG. 2. The magnetic field (202) is typically provided, at least in part, by an electromagnetic coil (204) (such as an electromagnetic tuning coil) for frequency tuning. In some embodiments, the strength of the magnetic field can be further enhanced by use of a larger electromagnet and/or permanent magnet (not shown). The spherical YIG resonator (102) is placed between the poles (206, 208) of this electromagnet. Frequency tuning is provided by changing the magnetic field (202), with fine tuning often provided using a variable DC current flowing through the electromagnet tuning coil (204).

To form an oscillator, the YIG resonator in the magnetic field device (200) is electrically connected (108) to other oscillator components, such as at least one active device (104), as well as optional attenuators and other components. These are all electrically connected together to form a closed circuit, often called an oscillator loop, but here called an oscillator circuit.

FIG. 3 shows a general block diagram of a conventional (prior art) feedback oscillator, here using typical YIG resonator electrical schematic symbols (110). Again, this can be viewed as being an oscillator circuit (or oscillator loop) (108a) comprising a YIG (102) resonator magnetically coupled to a coupling wire (106), and an active device.

The frequency of a YIG oscillator can be adjusted by varying the intensity of the YIG sphere's (YIG resonator's) magnetic field (202). This oscillator tuning is possible since the resonant frequency of the isotropic YIG resonator (102) in a uniform magnetic field is a nearly linear function of the magnetic field strength. The basic relationship between the YIG resonator resonant frequency f and magnetic field strength H is given as follows:

$f=\gamma H$, where: $\gamma=2.8$ MHz/Oe is the gyromagnetic ratio.

The gyromagnetic ratio is a physical constant, which is independent of the YIG resonator size.

One of the most valuable features of YIG oscillators (100, 300) is their wide frequency coverage. The oscillator's low frequency limit is determined by the YIG (or other type) resonator material. This becomes a low frequency limiting factor when the magnetic field becomes insufficient to align the magnetic particles within the YIG resonator itself.

The upper oscillation frequency of the YIG oscillator is limited by several practical design considerations. One major problem is high frequencies require correspondingly high magnetic fields. This often leads to high power consumption, because that the intensity of the magnetic field, at least for electromagnets, is typically in direct proportion to the electrical current, which can include any DC tuning current.

Another problem is that the ability to generate strong magnetic fields is also limited by the saturation of the materials used to form the magnet's structure, as well as linearity and hysteresis performance degradation. The high-inductance tuning coil (204) required to generate high-strength magnetic fields also acts to reduce the oscillator tuning speed.

Since the intensity of a magnetic field is typically inversely proportional to the gap length (e.g. the distance) between magnetic poles (206 and 208), higher magnetic fields can also be achieved by minimizing the gap distance (e.g. air gap) between the poles of the magnet. However when this air gap distance is reduced, the magnetic field uniformity in the vicinity of the YIG resonator is also reduced, and this can create some new and serious problems.

One problem is that the non-uniformity of the magnetic field (202) causes the YIG oscillator to operate in various unwanted spurious modes. These spurious modes differ from the main, uniform mode of the YIG oscillator, in that the phase and amplitude of the YIG sphere magnetization differs in different areas within the YIG sphere itself. The permissible degree of magnetic field variation for conventional YIG oscillators is about 130 A/m over a YIG resonator diameter. Higher field gradients lead to undesired spurious oscillations and discontinuities in frequency coverage.

As will be discussed, the oscillator's active device (104) can be another source of noise and instabilities.

It is therefore desirable to provide improved YIG oscillator devices and methods that allow such YIG oscillators to operate without such undesired spurious oscillations, discontinuities, and noise.

BRIEF SUMMARY OF THE INVENTION

The invention is based, in part, on the insight that both magnetic field non-uniformity and active device noise adversely impact YIG oscillator stability and phase noise performance, and that both types of problems may be addressed by a common solution.

In a uniform magnetic field, a spherical YIG resonator should have a relatively high unloaded Q-factor, which is in direct proportion to its operating frequency. This results in a nearly constant phase noise performance versus operating frequency. However the presence of magnetic field non-uniformity can lead to reduction of the YIG resonator Q-factor, and resulting phase noise degradation.

According to Leeson's formula (D. Leeson, "*A Simple Model of Feedback Oscillator Noise Spectrum,*" *IEEE Proceedings*, Vol. 54, No. 2, 1966, pp. 329-332), the oscillator phase noise can be reduced by maintaining a higher power level applied to the resonator.

The invention is based in part, on insights concerning the frequency characteristics of the phase noise of conventional feedback oscillators, such as those previously shown in FIG. 3. A graph of oscillator phase noise response versus offset frequency is shown in FIG. 4 (400).

Note that for offset frequencies higher than the oscillator half bandwidth $f_0/2Q$ (where Q is the resonator loaded Q-factor) (402), the phase noise is nearly flat (e.g. there is a noise floor) since the noise is mainly determined by the ratio of the oscillator signal level and active device thermal noise. For frequencies (404) between the half bandwidth and flicker corner frequency $f_\alpha$, the phase noise increases at 20 dB per decade.

In the last region (406), where the flicker noise dominates, the phase noise increases at 30 dB per decade. Thus, two frequency points—the half bandwidth and flicker corner frequency—create the shape of the phase noise curve, while its magnitude is mainly determined by the active device (104) noise figure and output power.

Traditional (e.g. prior art) phase noise reduction techniques taught methods to reduce these key frequencies by using high-Q, optimally coupled resonators, and low flicker noise active devices.

The invention is based, in part, on the insight that the phase noise can also be reduced by maintaining a higher power level applied to the resonator (102). This higher power level increases the signal power to thermal noise ratio, and shifts the entire phase noise curve downward, as is shown in FIG. 4 (408).

Unfortunately, severe phase noise degradation also occurs due to the elevation of the active device noise figure at compression. To avoid this, the active device should be preferably operated in a linear regime in order to keep its noise figure unchanged. Moreover, the flicker noise phenomenon (usually explained by up-conversion of active device DC noise in its non-linearities) is also affected by the active device compression.

The invention is also based, in part, on the insight that it is thus useful to further employ additional devices and methods that further help to reduce active device noise by allowing the active device to operate effectively but in a non-compression mode.

In some embodiments, this can be achieved by providing a dual YIG oscillator device. This device can comprise an active device that provides signal amplification to compensate for oscillator circuit component loss. This dual YIG oscillator device also comprises a stabilizing YIG resonator. The dual YIG oscillator is also configured, with the help of a stabilizing YIG resonator, to operate its active device in a low noise, linear regime. The dual YIG oscillator device will also comprise a main YIG resonator that provides high-Q energy storing, and can also be used (with the help of the stabilizing YIG resonator) to help eliminate spurious oscillation modes.

According to the invention, this stabilizing YIG resonator can be configured as a limiting component, providing steady-state oscillations (e.g. rejecting unwanted spurious modes of the main YIG resonator), as well as reducing active device noise by allowing the active device to operate a lower noise linear regime.

DETAILED DESCRIPTION OF THE INVENTION

Figure 1:
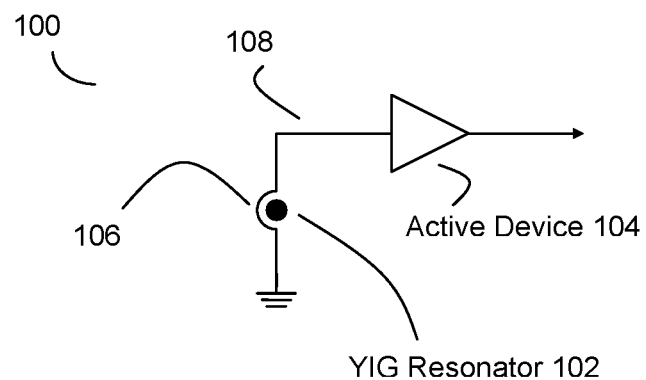
FIG. 1 is a simplified block diagram of a conventional (prior art) YIG oscillator.
Figure 2:
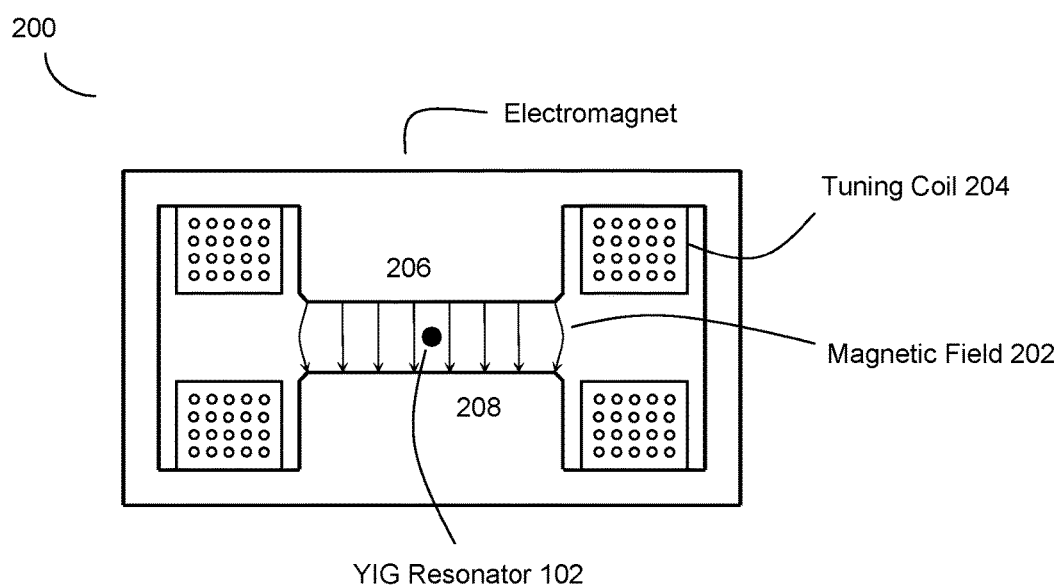
FIG. 2 is a simplified cross-sectional view of an exemplary magnetic structure of a conventional (prior art) YIG oscillator.
Figure 3:
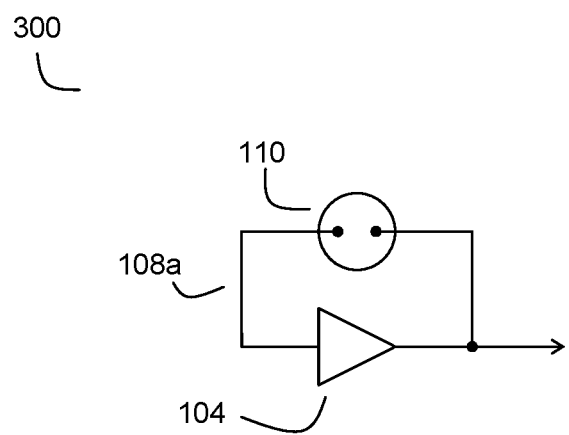
FIG. 3 is a general block diagram of a conventional (prior art) feedback oscillator.
Figure 4:
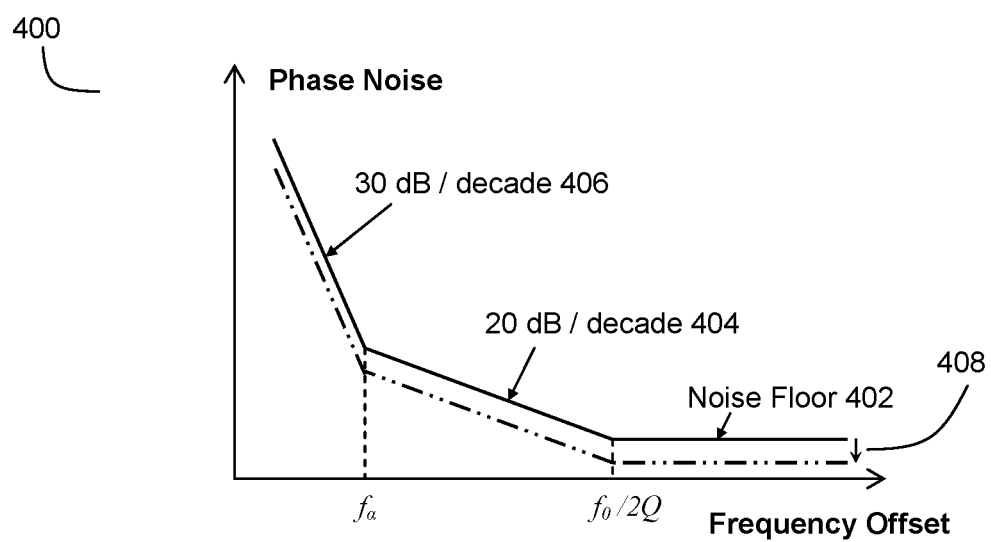
FIG. 4 is graph of oscillator phase noise response versus offset frequency. This depicts a phase noise reduction technique based on higher power levels applied to the resonator.

In some embodiments, the invention may be viewed as an improved YIG oscillator with lower phase noise. This improved YIG oscillator employs techniques to keep the oscillator's active device out of compression. The improved YIG oscillator employs methods and devices that also help reduce spurious modes of operation in the main YIG oscillator as well.

The invention relies on certain insights regarding the properties of YIG resonators. One insight is that there is a YIG resonator limiting phenomenon, where the YIG resonator tends to limit its output power (i.e., goes into compression) when it is driven at high power levels (e.g. above about +13 to +17 dBm or decibel-milliwatts). Under these conditions, the YIG resonator frequency response curve also becomes broader, and the Q-factor of the YIG resonator degrades. These high power level conditions make the YIG resonator less suitable (e.g. unsuitable) as a main oscillator resonator, but as we will see shortly, according to the invention, this does make the YIG resonator useful as a type of "stabilizing" YIG resonator.

Note that to make a good oscillator, that is to provide a high Q factor for low phase noise, a YIG resonator for an oscillator should have its power driving level set low enough (well below its compression) to keep its Q-factor high. Here these types of YIG resonators are termed main YIG resonators.

The invention is also based on the insight that the active device is another source of oscillator phase noise degradation. In conventional oscillators, the active device is run in compressed mode to stabilize the oscillator output signal, and to prevent the oscillator signal from running out of control due to positive feedback effects. Unfortunately, as a consequence of this compressed mode, the active device needs to operate in a very non-linear manner. As a result, underlying DC noise in the active device, which is always present, interacts with this non-linear active device mode, and this active device DC noise is converted and shows up in the RF output as another source of phase noise. This, of course, is highly undesirable.

The invention is also based, in part, on the insight that to prevent this non-linear active device DC amplified type phase noise, we need to use a different mechanism to keep the active device under compression. We need to avoid or minimize relying on running the active device in its non-linear mode. However to avoid a runaway oscillator, something else needs to be compressed.

To do this, according to the invention, this "something else" makes use of the previously discussed YIG oscillator limiting phenomenon. Specifically, the invention relies on the above YIG oscillator limiting phenomenon, as implemented by an additional (stabilizing) YIG resonator, to keep the active device out of compression. This reduces the problem of non-linear active device amplified DC phase noise, while still keeping the oscillator under control (e.g., avoiding runaway feedback effects).

This stabilizing YIG resonator approach has some other advantages as well. No magnetic field is ever completely uniform—all contain at least some non-uniform aspects. This can cause problems for YIG oscillators at high frequencies, because to get this high frequency oscillation, the magnetic field strength must be set to very high levels. This high strength magnetic field can be produced by increasing current to the device's magnetic coil, but this becomes impractical at very high current levels.

Alternatively the gap between the magnetic poles in the device can be reduced. This increases magnetic field strength, but it also increases the non-uniformity of the magnetic field. This non-uniformity in turn causes the YIG resonator to oscillate in various spurious modes (e.g. passbands are generated). These spurious modes can cause the oscillator to start oscillating at an undesired frequency, and/or become unstable.

According to the invention, however, use of a stabilizing YIG resonator, in addition to a main YIG resonator, can help also reduce problems caused by non-uniform magnetic fields. This is because although the stabilizing YIG resonator will also have its own spurious modes, because the stabilizing YIG resonator is typically driven at a very different power level. As a result, any stabilizing YIG resonator spurious modes will tend to not coincide with the stabilizing modes of the main YIG resonator.

In this scheme, the stabilizing YIG resonator in effect acts to reject the main resonator's spurious modes. This makes the invention's YIG oscillator more stable under the higher magnetic fields, smaller magnetic field gaps (and unavoidable less-uniform magnetic fields), that are often required when high frequency operation is desired.

Figure 5:
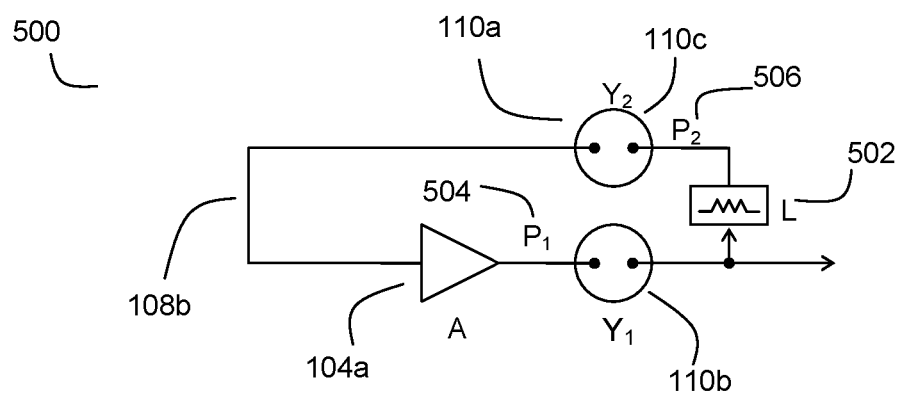
FIG. 5 is a simplified block diagram of the invention's dual-resonator YIG oscillator. It shows the main electrical components of the oscillator, specifically, an active device A, the stabilizing YIG resonator $Y_1$, main YIG resonator $Y_2$, and an attenuator L.

A simplified block diagram of the invention's dual-resonator YIG oscillator is shown in FIG. 5. This shows the main electrical components of the oscillator (500), and includes an active device A (104a), stabilizing YIG resonator $Y_1$ (110b) main YIG resonator $Y_2$ (110c) and an attenuator L (502), all connected in an oscillator circuit (108b).

Here $P_1$ (504) and $P_2$ (506) represent signal power levels applied to the stabilizing YIG resonator $Y_1$ (110b) and main YIG resonator $Y_2$, (110c) respectively. The oscillator (500) can also include a buffer amplifier, directional coupler, power supplies, and other additional components not shown here.

As previously discussed, the active device (104a) provides the signal amplification required to compensate for energy loss in the YIG resonators (110b, 110c) and other oscillator circuit components, in order to start oscillation. Frequency tuning is provided by changing the magnetic field (202a) applied to the YIG resonators, as is shown in FIG. 6.

Figure 6:
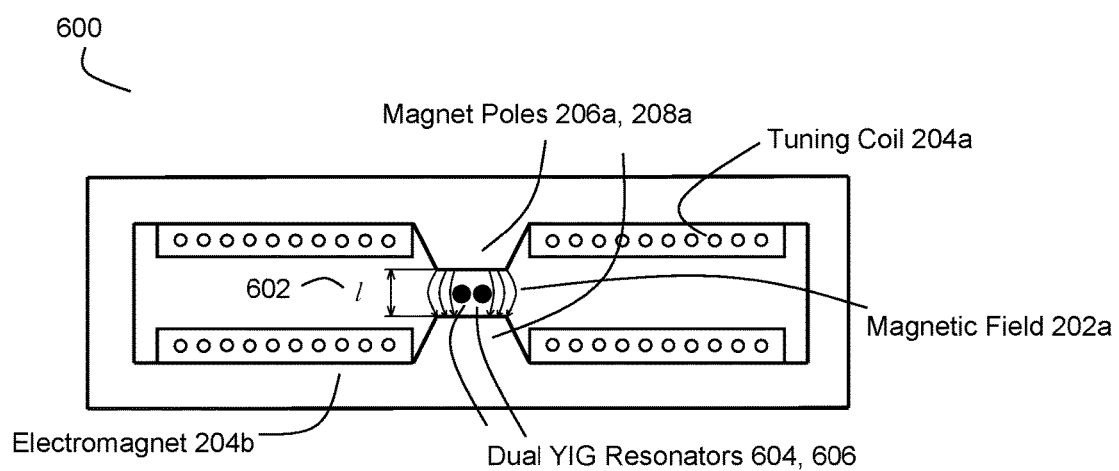
FIG. 6 is a simplified cross-sectional view of the magnetic structure of the invention's dual-resonator YIG oscillator. It shows the main magnetic components of the oscillator, specifically, an electromagnet with reduced air gap 1 between its poles, and the two (main and stabilizing) YIG resonators.

A simplified cross-sectional view of the magnetic structure (600) of the invention's dual-resonator YIG oscillator is shown in FIG. 6. This shows the main magnetic components of the oscillator, specifically, an electromagnet with reduced air gap l (602) between its poles (206a, 208a), and the two (main and stabilizing) YIG resonators (604, 606).

The magnetic structure of the dual YIG device includes an electromagnet (204a) (e.g. at least magnetic tuning coils and often a corresponding high power permanent magnetic or electromagnet 204b) and two YIG resonators (604, 606) connected to the other oscillator components with the help of corresponding oscillator circuitry (not shown). The YIG resonators (604, 606) are placed between the electromagnet poles (206a, 208a) and share the same magnetic field (202a). The air gap length "l" (602) between the magnet poles (206a, 208a) is preferably reduced to increase the magnetic field strength that results in higher frequency operation, faster tuning and lower power consumption.

Thus in some embodiments, the invention may comprise a YIG oscillator device (500), comprising: a stabilizing YIG resonator (110b, 604) and a main YIG resonator (110c, 606), both positioned in a common magnetic field (202a). The main YIG resonator has a main Q factor, which is configured to be higher (e.g. often two times higher or more) than the stabilizing Q factor of the stabilizing YIG resonator.

The stabilizing YIG resonator (110b, 604) is magnetically coupled to a stabilizing coupling wire (such as 106). Similarly the main YIG resonator (110c, 606) is also magnetically coupled to a main coupling wire. The stabilizing coupling wire and main coupling wire are electrically connected (108b) with at least one active device (104a) to form an oscillator circuit.

The main coupling wire is typically configured to be optimally coupled to the main YIG resonator (110c, 606), and the stabilizing coupling wire is typically configured to be tightly coupled to the stabilizing YIG resonator (110b, 604). The YIG oscillator device (500) will often be further configured with the main coupling wire, main Q factor, stabilizing coupling wire and stabilizing Q factor selected so that in operation, the main YIG resonator is a main resonator of the YIG oscillator device. The stabilizing YIG resonator is configured so that it limits the output power of the at least one active device (104a), and keeps this at least one active device under compression, thus reducing the phase noise of the oscillator circuit (108b).

In a typical embodiment, this at least one active device (104a) is configured to provide signal amplification to compensate for energy losses in the oscillator circuit (108b). Additionally, this at least one active device (104a) is also often configured to drive the stabilizing YIG resonator (110b, 604), by the stabilizing coupling wire, at a stabilizing electrical power level configured to be above a resonator compression point of the stabilizing YIG resonator.

In a typical embodiment, the at least one active device (104a) is also configured to receive input from the main YIG resonator via the main coupling wire, and to couple an output of the at least one active device (104*a*) to the stabilizing YIG resonator via the stabilizing coupling wire.

In some embodiments, the at least one active device (104*a*) and/or oscillator circuit (108*b*) is configured to drive the main YIG resonator (110*c*, 606), by the main coupling wire, at a main electrical power level $P_2$ (506) configured to be well below a resonator compression point of the main YIG resonator to avoid main resonator Q-factor degradation.

Here, the YIG oscillator device may be further configured with at least one attenuator device, (502) configured to set the main electrical power level P2 (506) below a resonator compression point of the main YIG resonator (110*c*, 606). Additionally, the device may also be configured to connect an output of the stabilizing coupling wire to an input of the main coupling wire.

Figure 7:
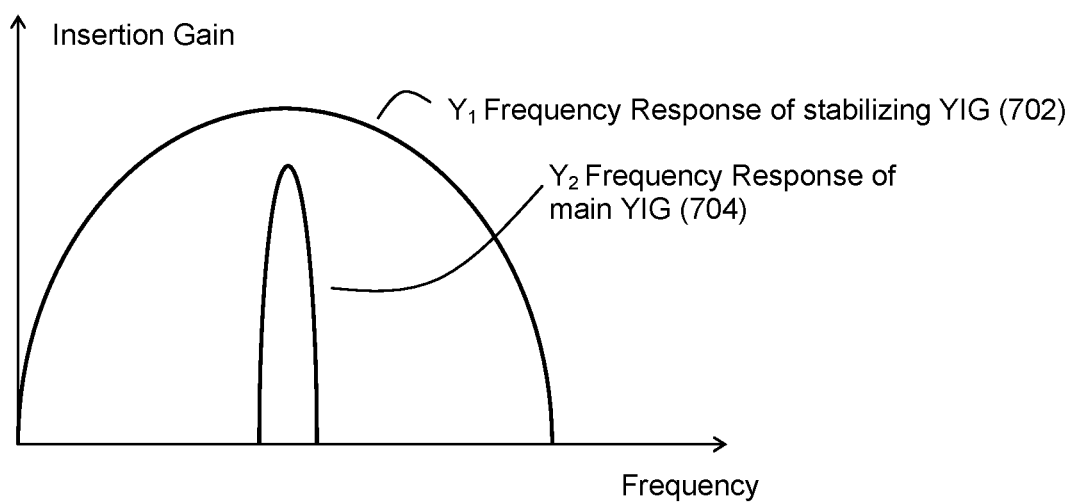
FIG. 7 shows the comparative frequency response of the main and stabilizing YIG resonators in the oscillator circuit.

As shown in more detail in FIG. 7, in a preferred embodiment, the YIG oscillator device may also be configured so that the stabilizing YIG resonator (110*b*, 604) has a frequency response (702) configured to be overlapping with, but substantially broader than, a frequency response of main YIG resonator (110*c*, 606) (704).

As with most YIG oscillator devices, the invention's dual YIG oscillator device is also configured so that a frequency of oscillation of the invention's dual YIG oscillator device is set by configuring an intensity of the common magnetic field (202*a*).

Further discussion:

As previously discussed, the invention is based, in part, on insights regarding the non-linear behavior of the YIG resonator at large incident RF power levels. This phenomenon is of particular importance in that it manifests itself as a signal-dependent, limiting mechanism. Such a mechanism allows the YIG oscillator to achieve steady state oscillations, while still keeping the active device in a low noise, linear regime.

The invention is also based, in part, on the insight that high incident RF power levels result in broadening of YIG resonator resonance curves in general, and consequently their Q-factor degradation.

An important aspect of the invention is the concept of separating the YIG resonator high-Q storage and limiting functions. This can be achieved by using two YIG resonators working in different regimes, as previously depicted in FIG. 5 and as further explained below.

As previously discussed, active devices, such as A (104*a*) are preferably operated in a linear regime, delivering the output power $P_1$ (504) at a level that just exceeds the compression point of the stabilizing YIG resonator (110*b*, 604).

In this scheme, the stabilizing YIG resonator (110*b*, 604), preferably configured in a tightly coupled, low-Q, resonator configuration, provides the necessary compression mechanism, and helps assure steady-state oscillations. The main YIG resonator (110*c*, 606), preferably configured to be optimally coupled, is operated at power level $P_2$ (506) which is set below the compression point of the main YIG resonator in order to prevent its Q-factor from being degraded. Here the required power level can be set with attenuator L (502).

An important aspect of the invention is that the stabilizing and main YIG resonator are operated under different conditions so as to provide different amounts of coupling. The stabilizing and main YIG resonators should also be operated at different incident power levels, so that the two YIG oscillators have different (e.g. unmatched) spurious modes.

As previously discussed, the stabilizing YIG resonator thus acts to prevent undesired oscillation regimes by rejecting the spurious modes of the main YIG resonator. Often, however, no precise frequency alignment between the two YIG resonators is required, since as shown in FIG. 7, the frequency response of the stabilizing YIG resonator (702) is ideally configured to be substantially broader than, but overlapping with, the frequency response of the main YIG resonator (704).

FIG. 7 shows the comparative frequency response of the main (704) and stabilizing (702) YIG resonators in the oscillator circuit (500).

Note the contrast between the present invention, and the prior art of Grace (U.S. Pat. Nos. 5,115,209 and 5,200,173) which taught two co-packaged YIG oscillators that worked, essentially independently of each other, in different frequency bands. In contrast to the work of Grace, the present art uses the main YIG resonator and the stabilizing YIG resonator for very different purposes. According to the present invention, the main YIG resonator is used as a regular high-Q resonator that sets oscillation frequency, while the stabilizing YIG resonator is used as a YIG limiter to prevent compression of the oscillator's active device, thus reducing oscillator phase noise degradation. Note that according to the invention, both resonators work in essentially the same frequency region (although with different bandwidth, as was previously shown in FIG. 7).

As previously discussed, a valuable feature of the invention is its ability to reject undesired spurious modes created by the non-uniform, high-strength magnetic field (202*a*), previously shown in FIG. 6.

This in turn allows use of improved magnetic structures (600) that can produce a substantially stronger magnetic field in comparison with prior art YIG oscillators. These stronger magnetic fields in turn allows for construction of improved YIG oscillators with higher frequency operation, reduced power consumption, and higher tuning speed. Moreover, as previously discussed, the invention's devices and methods help assure that the oscillator's active device (104*a*) is operated in a linear regime that results in improved phase noise performance.

Therefore, as compared to conventional YIG oscillators, the invention's dual-resonator YIG oscillator provides significant performance improvements over the prior art, including higher frequency operation, lower power consumption, higher tuning speed and lower phase noise.

The invention claimed is:

1. A YIG oscillator device, comprising:
a stabilizing YIG resonator and a main YIG resonator, both positioned in a common magnetic field, said main YIG resonator having a main Q factor, said stabilizing YIG resonator having a stabilizing Q factor;
said main Q factor being configured to be higher than said stabilizing Q factor;
said stabilizing YIG resonator being magnetically coupled to a stabilizing coupling wire, and said main YIG resonator being magnetically coupled to a main coupling wire, said stabilizing coupling wire and said main coupling wire being electrically connected with at least one active device to form an oscillator circuit;
wherein said main coupling wire is configured to be optimally coupled to said main YIG resonator, and wherein said stabilizing coupling wire is configured to be tightly coupled to said stabilizing YIG resonator;
said YIG oscillator device further configured with said main coupling wire, said main Q factor, said stabilizing coupling wire and said stabilizing Q factor selected so that in operation, said main YIG resonator is a main resonator of said YIG oscillator device, and said stabilizing YIG resonator limits output power of said at least one active device, and keeps said at least one active device under compression, thus reducing phase noise of said oscillator circuit.

2. The YIG oscillator device of claim 1, wherein said at least one active device is configured to provide signal amplification to compensate for energy losses in said oscillator circuit.

3. The YIG oscillator device of claim 2, wherein said at least one active device is also configured to drive said stabilizing YIG resonator, by said stabilizing coupling wire, at a stabilizing electrical power level configured to be above a resonator compression point of said stabilizing YIG resonator.

4. The YIG oscillator device of claim 3, wherein said at least one active device is configured to receive input from said main YIG resonator via said main coupling wire, and to couple an output of said at least one active device to said stabilizing YIG resonator via said stabilizing coupling wire.

5. The YIG oscillator device of claim 2, wherein said at least one active device is configured to drive said main YIG resonator, by said main coupling wire, at a main electrical power level configured to be well below a resonator compression point of said main YIG resonator to avoid its Q-factor degradation.

6. The YIG oscillator device of claim 5, further configured with at least one attenuator device, said at least one attenuator device further configured to set said main electrical power level below a resonator compression point of said main YIG resonator.

7. The YIG oscillator device of claim 6, wherein said at least one attenuator device is configured to connect an output of said stabilizing coupling wire to an input of said main coupling wire.

8. The YIG oscillator device of claim 1, wherein said stabilizing YIG resonator has a frequency response configured to be overlapping with, but substantially broader than, a frequency response of said main YIG resonator.

9. The YIG oscillator device of claim 1, wherein a frequency of oscillation of said YIG oscillator device is set by adjusting an intensity of said common magnetic field.

10. The YIG oscillator device of claim 1, wherein said main Q factor is configured to be at least two times higher than said stabilizing Q factor.

11. A method of reducing phase noise degradation of a YIG oscillator device, said method comprising:
obtaining a stabilizing YIG resonator and a main YIG resonator in a common magnetic field, said main YIG resonator having a main Q factor, said stabilizing YIG resonator having a stabilizing Q factor;
said main Q factor selected to be higher than said stabilizing Q factor;
said stabilizing YIG resonator magnetically coupled to a stabilizing coupling wire, and said main YIG resonator magnetically coupled to a main coupling wire, said stabilizing coupling wire and said main coupling wire being electrically connected with at least one active device to form an oscillation circuit;
wherein said main coupling wire is optimally coupled to said main YIG resonator, and wherein said stabilizing coupling wire is tightly coupled to said stabilizing YIG resonator;
operating said YIG oscillator device, said main coupling wire, said main Q factor, said stabilizing coupling wire and said stabilizing Q factor so that said main YIG resonator is a main resonator of said YIG oscillator device, and said stabilizing YIG resonator limits output power of said at least one active device, and keeps said at least one active device under compression, thus reducing phase noise of said oscillator circuit.

12. The method of claim 11, wherein said at least one active device is configured to provide signal amplification to compensate for energy losses said oscillator circuit.

13. The method of claim 12, further using said at least one active device to also drive said stabilizing YIG resonator, by said stabilizing coupling wire, at a stabilizing electrical power level configured to be above a resonator compression point of said stabilizing YIG resonator.

14. The method of claim 13, further using said at least one active device to receive input from said main YIG resonator via said main coupling wire, and to couple an output of said at least one active device to said stabilizing YIG resonator via said stabilizing coupling wire.

15. The method of claim 12, further using said at least one active device to drive said main YIG resonator, by said main coupling wire, at a main electrical power level that is below a resonator compression point of said main YIG resonator.

16. The method of claim 15, further using at least one attenuator device to set said main electrical power level below a resonator compression point of said main YIG resonator.

17. The method of claim 16, further using said at least one attenuator device to connect an output of said stabilizing coupling wire to an input of said main coupling wire.

18. The method of claim 11, further selecting said stabilizing YIG resonator to have a frequency response configured to be overlapping with, but substantially broader than, a frequency response of said main YIG resonator.

19. The method of claim 11, further setting a frequency of oscillation of said YIG oscillator device by adjusting an intensity of said common magnetic field.

20. The method of claim 11, wherein said main Q factor is configured to be at least two times higher than said stabilizing Q factor.

* * * * *